United States Patent
Vellaikal et al.

(10) Patent No.: US 7,659,184 B2
(45) Date of Patent: Feb. 9, 2010

(54) PLASMA IMMERSION ION IMPLANTATION PROCESS WITH CHAMBER SEASONING AND SEASONING LAYER PLASMA DISCHARGING FOR WAFER DECHUCKING

(75) Inventors: Manoj Vellaikal, Sunnyvale, CA (US); Kartik Santhanam, Fremont, CA (US); Yen B. Ta, Cupertino, CA (US); Martin A. Hilkene, Gilroy, CA (US); Matthew D. Scotney-Castle, Morgan Hill, CA (US); Canfeng Lai, Fremont, CA (US); Peter I. Porshnev, San Jose, CA (US); Majeed A. Foad, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 48 days.

(21) Appl. No.: 12/072,495

(22) Filed: Feb. 25, 2008

(65) Prior Publication Data

US 2009/0215251 A1     Aug. 27, 2009

(51) Int. Cl.
*H01L 21/20*     (2006.01)
(52) U.S. Cl. .................. 438/480; 438/506; 438/514; 438/766; 438/E21.568
(58) Field of Classification Search ......... 438/450–451, 438/473, 480, 505–506, 514–518, 766
See application file for complete search history.

(56) References Cited

U.S. PATENT DOCUMENTS

| | | | |
|---|---|---|---|
| 5,424,222 A | * | 6/1995 | Arndt ........................... 438/57 |
| 5,543,336 A | * | 8/1996 | Enami et al. ................. 438/528 |
| 6,589,868 B2 | | 7/2003 | Rossman |

FOREIGN PATENT DOCUMENTS

WO    WO 2007/105412 A1    9/2007

OTHER PUBLICATIONS

Patent Abstracts of Japan Japanese Publication No. JP08031752A, Published Feb. 2, 1996, Entitled Cleaning and Coating of Reaction Chamber of CVD System.

* cited by examiner

*Primary Examiner*—Dung A. Le
(74) *Attorney, Agent, or Firm*—Law Office of Robert M. Wallace

(57) ABSTRACT

In a plasma immersion ion implantation process, the thickness of a pre-implant chamber seasoning layer is increased (to permit implantation of a succession of wafers without replacing the seasoning layer) without loss of wafer clamping electrostatic force due to increased seasoning layer thickness. This is accomplished by first plasma-discharging residual electrostatic charge from the thick seasoning layer. The number of wafers which can be processed using the same seasoning layer is further increased by fractionally supplementing the seasoning layer after each wafer is processed, which may be followed by a brief plasma discharging of the supplemented seasoning before processing the next wafer.

13 Claims, 7 Drawing Sheets

PLASMA IMMERSION ION IMPLANTATION PROCESS WITH CHAMBER SEASONING AND SEASONING LAYER PLASMA DISCHARGING FOR WAFER DECHUCKING

BACKGROUND

Plasma immersion ion implantation is performed by generating a plasma containing ions of species to be implanted in a semiconductor wafer or workpiece. The plasma may be generated using a plasma source such as a toroidal plasma source at the reactor chamber ceiling. Ion energy sufficient to achieve a desired ion implantation depth profile below the wafer surface is provided by coupling a very high RF bias voltage (e.g., 10 kV to 20 kV) to the semiconductor wafer through an insulated cathode electrode within the wafer support pedestal. Such a high bias voltage requires a correspondingly high D.C. electrostatic wafer clamping voltage on the electrostatic chuck to hold the wafer during plasma immersion ion implantation. High implant dose rate requires a high plasma ion density, which is achieved using a toroidal plasma source operating at a low chamber pressure. The requisite ion implant depth profile requires a very high ion energy, which is achieved by applying a very high RF bias voltage across the plasma sheath at the wafer surface. The process gas employed in plasma immersion ion implantation can be a fluoride or a hydride of the dopant species to be implanted.

In DRAM/flash memory fabrication, it is necessary to implant a semiconductor dopant species into the polycrystalline silicon (polysilicon) gate electrodes to increase their conductivity. The gate electrodes are formed by depositing amorphous silicon on a thin gate oxide layer and then annealing the wafer sufficiently to transform the deposited silicon from the amorphous state to a polycrystalline state. The polycrystalline silicon gate layer thus formed is about 20 nm to 80 nm thick. The implanted species is one that promotes p-type semiconductivity in silicon, such as boron, or n-type semiconductivity, such as arsenic, phosphorus, and antimony. The plasma immersion ion implantation process must be carried out for a sufficient time to attain a required ion implant dosage in the polysilicon gate layer, corresponding to an electrical resistivity in the range 100-1000 Ohm/sq.

The polysilicon gate electrode must be kept free of metal (e.g., aluminum) contamination. Such contamination is caused by sputtering of the chamber interior surfaces during the plasma immersion ion implantation process, which introduces metal atoms into the plasma environment facing the gate electrode.

SUMMARY

A process is provided for plasma immersion ion implanting a succession of semiconductor wafers in a plasma reactor. The process includes coating the interior surfaces of the reactor including a wafer support surface with a silicon-containing seasoning layer of an initial thickness sufficient to avoid reduction below a minimum threshold thickness over plasma immersion of a successive number of wafers, by maintaining a deposition plasma in the chamber. Then, a plasma of an inert species is maintained in the chamber for a sufficient time to remove residual electrostatic charge from the seasoning layer and all other dielectric surfaces in the vicinity of the wafer (for example, the process ring made of ceramic) Thereafter, for each one of said successive number of wafers, the current wafer is introduced into the chamber, and an ion implantation plasma is maintained in the chamber for a sufficient time to realize a desired ion implant dose in the wafer. This is followed by removing the current wafer from the reactor and introducing the next wafer of the succession into the chamber. After the succession of wafers has been processed, the seasoning layer is replaced.

A greater number of wafers may be processed before seasoning layer replacement in another embodiment. In this other embodiment, the following step is performed after processing each wafer in the succession of wafers: compensating for a fractional loss of material from the seasoning layer that occurred during processing of the current wafer in the chamber, by depositing a corresponding amount of silicon-containing seasoning material on said seasoning layer. The foregoing step may be immediately followed by an RF discharge step in which a plasma of an inert species is maintained in the chamber for a sufficient time to remove residual electrostatic charge from the seasoning layer, prior to processing each wafer in the succession of wafers.

BRIEF DESCRIPTION OF THE DRAWINGS

So that the manner in which the exemplary embodiments of the present invention are attained and can be understood in detail, a more particular description of the invention, briefly summarized above, may be had by reference to the embodiments thereof which are illustrated in the appended drawings. It is to be appreciated that certain well known processes are not discussed herein in order to not obscure the invention.

Figure 1:
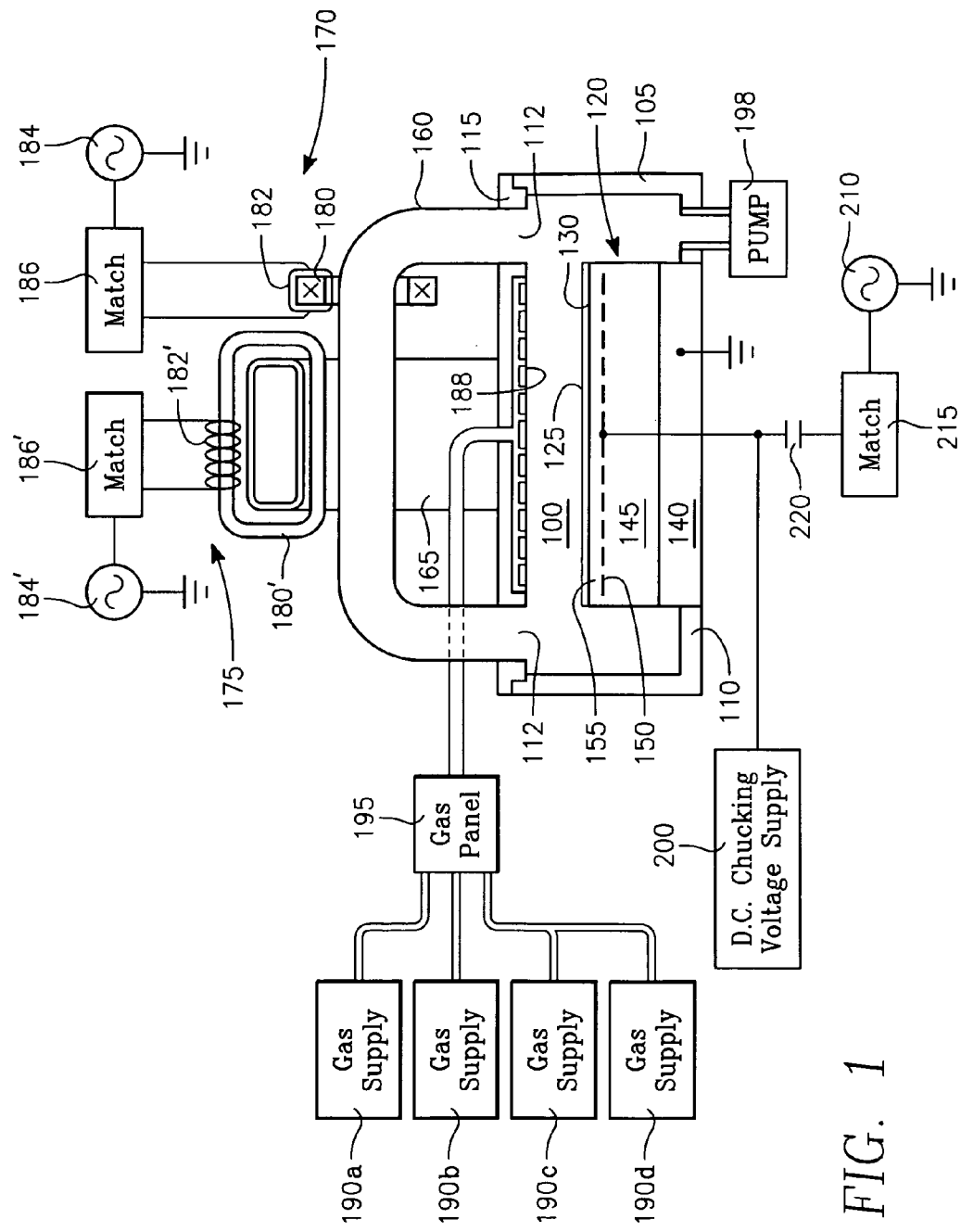
FIG. 1 is a simplified diagram of a plasma reactor employed in a process of one embodiment.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

Metallic contamination of the ion implantation process is prevented by coating the chamber interior surfaces with a seasoning film composed of a process-compatible material, for example, silicon dioxide or other films (silicon or carbon based) can be used. The seasoning film or layer may be 4000 to 9000 Å thick. Thereafter, the wafer is introduced into the chamber and the plasma immersion ion implantation process is performed. During the implantation process, the plasma etches a portion of the seasoning film, reducing its thickness. If the initial seasoning film thickness is not sufficient, portions of the seasoning film may be removed, exposing underlying metal material. To prevent this, the seasoning film is deposited to a thickness sufficient to survive the plasma immersion ion implantation of at least one wafer. After removing the wafer, the seasoning film is etched or removed in a separate plasma etch process, and a new seasoning film is deposited prior to ion implantation of the next wafer.

In one embodiment, productivity may be significantly increased by depositing the seasoning film to a thickness sufficient to survive over the ion implantation of several wafers (e.g., five), and not replacing the seasoning layer until the several wafers have been successively ion implanted in the reactor. The problem is that the increased thickness of the seasoning layer enables it to accumulate a correspondingly greater amount of residual electrostatic charge during the seasoning layer deposition process. The increased residual charge in the seasoning layer creates certain problems. Specifically, the residual charge can oppose the electrostatic clamping force applied by the electrostatic chuck holding the wafer. As a result, the wafer can pop off of the electrostatic chuck during the subsequent plasma immersion ion implantation step. This problem worsens with increasing seasoning layer thickness. Therefore, the extent to which the seasoning layer may be increased to accommodate use of a single seasoning layer over implantation of multiple wafers is greatly limited to just a few wafers, or only a single wafer in some cases.

Therefore, there is a need to increase productivity by expanding the number of wafers over which a single seasoning layer may be used without loss of electrostatic clamping of the wafer due to residual charge in the seasoning layer.

Productivity is increased by increasing the number of wafers that are processed by plasma immersion ion implantation with a single seasoning layer. The seasoning layer is deposited to an initial thickness that is sufficiently great to survive plasma immersion ion implantation of a large number of wafers. The initial thickness does not have to be limited to avoid the effects of residual electrical charge in the seasoning layer. Instead, immediately after seasoning layer deposition, all or nearly all of the residual charge is removed from the seasoning layer by generating a high density inert gas plasma over the seasoning layer in the absence of the wafer. In one embodiment, the gas used to remove the residual charge is a species having low ionization energy and high plasma conductivity, such as Argon. It is only necessary to sustain this plasma for a few seconds in order to completely discharge the seasoning layer. Thereafter, the plasma is extinguished and the first of a succession of wafers is introduced into the chamber for plasma immersion ion implantation.

A toroidal source plasma immersion ion implantation reactor in which the seasoning layer deposition process and the plasma immersion ion implantation process is performed is now described. Referring to FIG. 1, a plasma immersion ion implantation reactor has a chamber 100 enclosed by a cylindrical side wall 105, a floor 110 and a ceiling 115. A wafer support pedestal 120 within the chamber 100 may be an electrostatic chuck capable of electrostatically clamping a semiconductor wafer 125 onto a wafer support surface 130 of the chuck 120. The chuck 120 may consist of a grounded conductive base layer 140, an insulating layer 145 overlying the base layer 140, a thin cathode electrode 150 overlying the insulating layer 145, and a top insulating layer 155 overlying the cathode electrode 150 and forming the wafer support surface 130. The material of the insulating layers 145, 155 may be a ceramic material. The cathode electrode 150 may be a thin metallic mesh formed of molybdenum.

The reactor of FIG. 1 has a toroidal plasma source including a pair of transverse external reentrant conduits 160, 165 each extending across the diameter of the chamber 100 and coupled at their ends to the interior of the chamber 100 through ports 112 in the ceiling 115. RF power applicators 170, 175 couple RF power into the interior of the reentrant conduits 160, 165 respectively. The RF power applicator 170 consists of a magnetically permeable ring 180 wrapped around the conduit 160, a conductive coil 182 wrapped around a portion of the ring 180 and an RF power generator 184 coupled to the coil 182 through an RF impedance match element 186. The RF power applicator 175 consists of a magnetically permeable ring 180' wrapped around the conduit 165, a conductive coil 182' wrapped around a portion of the ring 180' and an RF power generator 184' coupled to the coil 182' through an RF impedance match element 186'.

The ceiling 115 includes a gas distribution plate 188. Process gas supplies 190a, 190b, 190c, 190d furnish process gas through a user-controllable gas panel 195 to the gas distribution plate 188. The chamber 100 is evacuated by a vacuum pump 198. In one example, the gas supply 190a contains the dopant hydride or dopant fluoride gas. The gas may be a hydride or fluoride of boron, phosphorus, arsenic or antimony, or the like. The gas supply 190b stores Ar gas. The gas supplies 190c and 190d store gas precursors of a seasoning material for plasma enhanced chemical vapor deposition of a seasoning layer prior to introduction of the wafer into the chamber. In one embodiment, the seasoning layer to be deposited is silicon dioxide (or a silicon oxide species), and the gas supply 190c stores silane ($SiH_4$) while the gas supply 190d stores oxygen.

The electrostatic chuck 120 further includes a user-controllable D.C. chucking voltage supply 200 connected to the mesh electrode 150. An RF bias power generator 210 capable of generating extremely high RF bias voltages is coupled to the mesh electrode 150 through an RF impedance match circuit 215 and through an optional isolation capacitor 220 (which may be included in the impedance match circuit 215). In order to provide a useful ion implantation depth profile in the wafer 125, the RF bias voltage generator 210 is operated at a sufficiently high power level to produce an RF bias voltage across the plasma sheath at the wafer surface on the order of 10 kV or more. This voltage controls the ion implantation depth profile.

In one working example, a relatively thick dielectric seasoning layer is deposited over the interior surfaces of the chamber, to a thickness of about 4000 to 9000 Å. Such a thick seasoning layer can be used over successive ion implantation processing of a large number of wafers without risk of loss of the seasoning film from the interior chamber surfaces. The seasoning layer is deposited by flowing into the chamber silane gas from the gas supply 190c and oxygen gas from the gas supply 190d while applying plasma source power from one or both of the RF plasma source power generators 184 and 184'. The resulting plasma supports chemical vapor deposition of a silicon oxide seasoning layer over the internal chamber surfaces. This plasma is sustained until a seasoning layer has been deposited to the desired thickness (e.g., 4000-9000 Å). Thereafter, the foregoing process gases are removed.

During the chemical vapor deposition process, the seasoning layer that is deposited accumulates a residual electrical charge (as do other dielectric surfaces that may be immersed in the plasma such as a dielectric process ring made of ceramic). The residual electrical charge in the seasoning layer is removed in a special seasoning layer discharge process. The seasoning layer discharge process is performed by generating a plasma suitable for discharging the seasoning layer residual charge. For this purpose, the plasma is formed of a relatively non-reacting gas having a low ionization energy and which tends to produce a plasma having a relatively high conductivity. Such a gas is Argon. In the foregoing, Argon is introduced into the chamber, and an Argon plasma is generated by source power from the RF plasma source power generators 184, 184'. In one embodiment, the Argon gas flow rate was in a range of 50-500 sccm (standard cubic centimeters per minute), and the RF power furnished by the source power generators 184, 184' was sufficient (e.g., 200-500 Watts) to generate an Argon plasma of between $10^{10}$ and $10^{11}$ ions/cm$^3$. We have found that a silicon oxide seasoning layer of about 7000 Å in thickness is completely discharged of residual electric charge within about 2 seconds by this step, although a longer discharge time (e.g., 15 seconds) may be used.

After the residual charge has been removed from the seasoning layer (and any other dielectric surfaces in the vicinity of the wafer), a large number of wafers may be ion implanted in succession by plasma immersion ion implantation in the chamber. A plasma immersion ion implantation process is repeatedly carried out to ion implant a succession of wafers using the same seasoning layer. In a working example, the ion implantation process for each wafer is as follows: A wafer was electrostatic-ally clamped on the chuck 120 with a D.C. chucking voltage in a range of 5000-10,000 volts. The gas panel 195 provided a gas flow rate of 50-200 sccm (standard cubic centimeters per minute) of a dopant-containing gas such as a fluoride or a hydride of the dopant (e.g., $BF_3$ or $B_2H_6$) from the gas supply 190*a*, and a gas flow rate of 20-300 sccm of Ar gas from the gas supply 190*b* to the ceiling gas distribution plate 188. The toroidal plasma source power generators 184, 184' each produced 200-5000 Watts of RF power at about 13.56 MHz, each being slightly offset in frequency from the other by a fraction of 1 MHz. In other embodiments, the frequency may lie anywhere in a range of about 1-60 MHz. The bias power generator 210 provided sufficient RF power at a frequency of about 2 MHz to produce an RF bias voltage across the plasma sheath over the wafer 125 of about 200-15,000 volts. In other embodiments, the bias power RF frequency may lie anywhere in a range of 0.5-60 MHz. The vacuum pump 198 operated at an evacuation rate sufficient to maintain the chamber pressure in a range of 3-100 mT. After the ion implantation step was carried out for a sufficient time to reach a desired implant dose in the wafer surface, the plasma was extinguished and the wafer was removed from the chuck 120, and the ion implantation is repeated for the next wafer. During plasma immersion ion implantation of each wafer, etchant (e.g., fluorine-containing) plasma ions and radicals are generated from the dopant-containing process gas (e.g., $BF_3$) that etch away a fraction of the seasoning layer, reducing its thickness.

The initial thickness of the seasoning layer is sufficiently great (e.g., 4000 Å to 9000 Å) to survive intact (e.g., retain a minimum thickness) during successive plasma immersion ion implantation of a large number (e.g., ten) semiconductor wafers. This large thickness may be tolerated without a deleterious loss of electrostatic chucking force on the wafer because the seasoning layer has been discharged of its residual electrostatic charge, as described above (i.e., the electrostatic charge accumulated during seasoning layer deposition). In one example, the initial seasoning layer thickness was 9000 Å, and, after ion implantation of about 10 wafers in succession in the chamber, the remaining seasoning layer thickness was 3000 Å. No further wafers are ion implanted because the seasoning layer thickness may be further reduced (during any subsequent ion implantation steps), increasing the risk of metallic contamination.

After ion implantation of the desired number (e.g., ten) of semiconductor wafers, the last wafer is removed from the chamber, and the seasoning layer is removed. The seasoning layer is removed by introducing into the chamber a process gas that is a precursor of a silicon oxide etchant, such as a fluorine-containing compound of the type including a fluorocarbon or a fluoro-hydrocarbon. Plasma source power from the source power generators 184, 184' is applied to generate and maintain a plasma until all of the seasoning layer has been removed. Thereafter, a new seasoning layer is deposited as described above, and then subject to plasma discharge of its residual electrostatic charge, in preparation for ion implantation of another succession of semiconductor wafers.

Figure 2A:
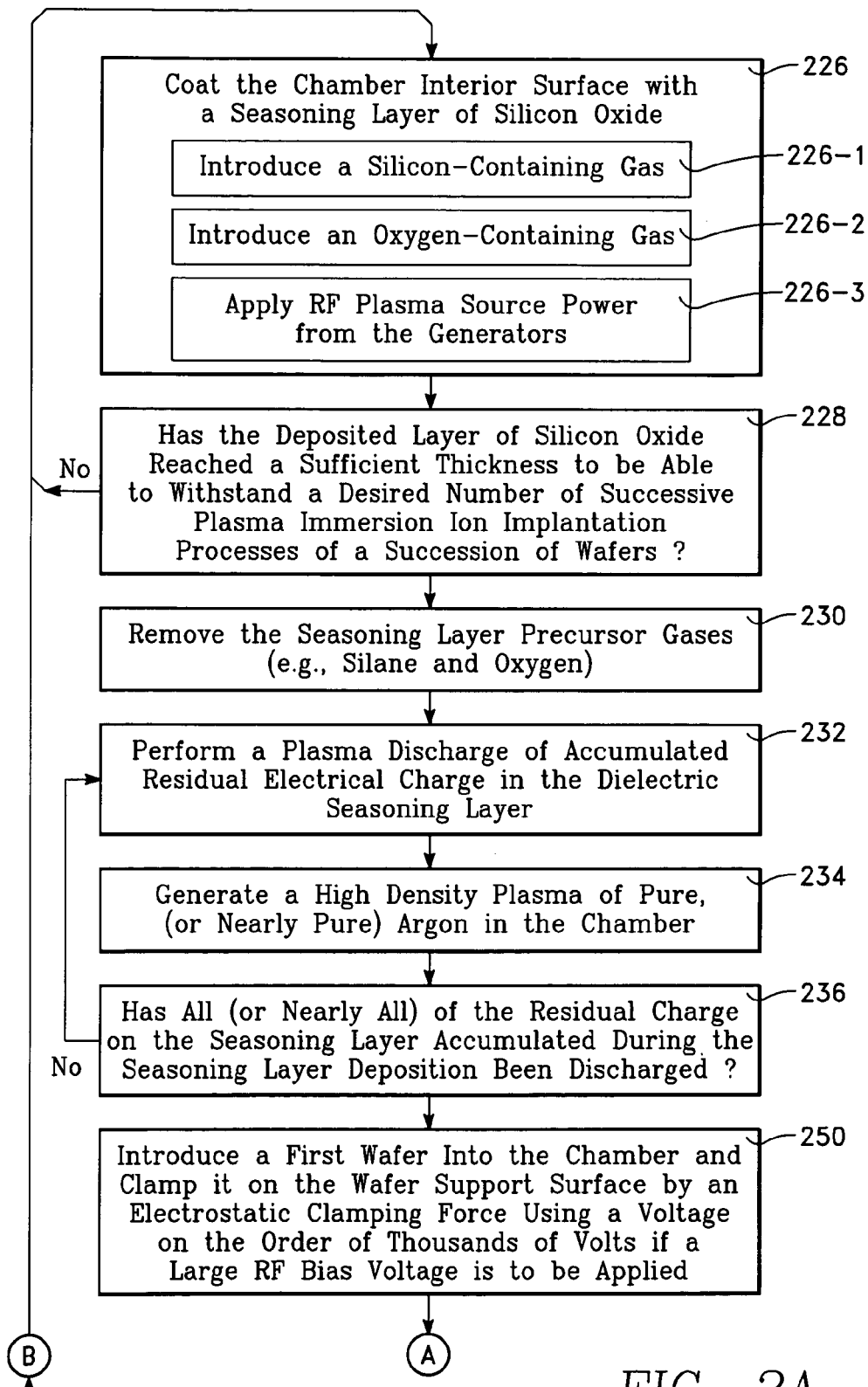
FIGS. 2A and 2B constitute a flow diagram depicting a process in accordance with one embodiment.
Figure 2B:
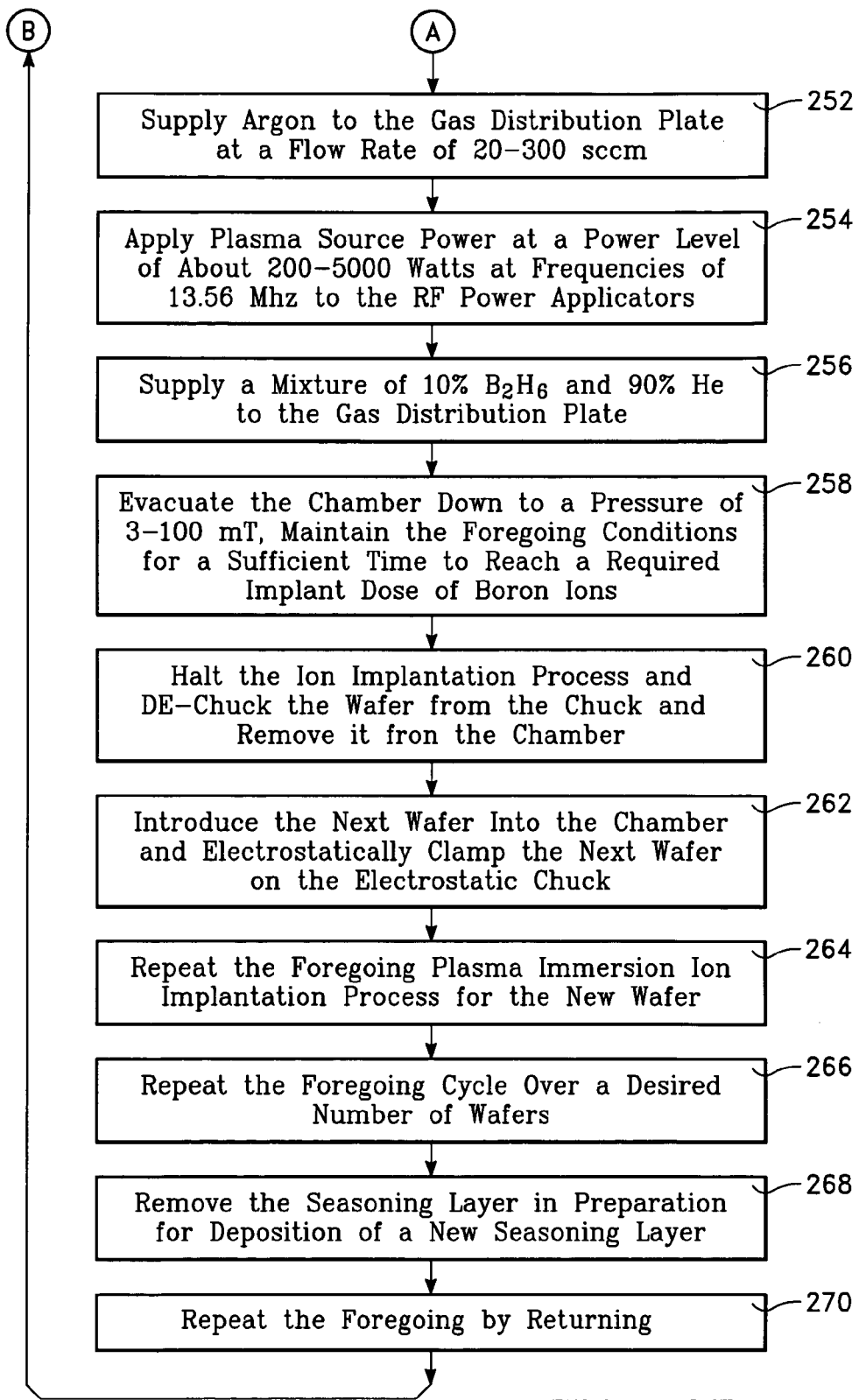
Figure 3A:
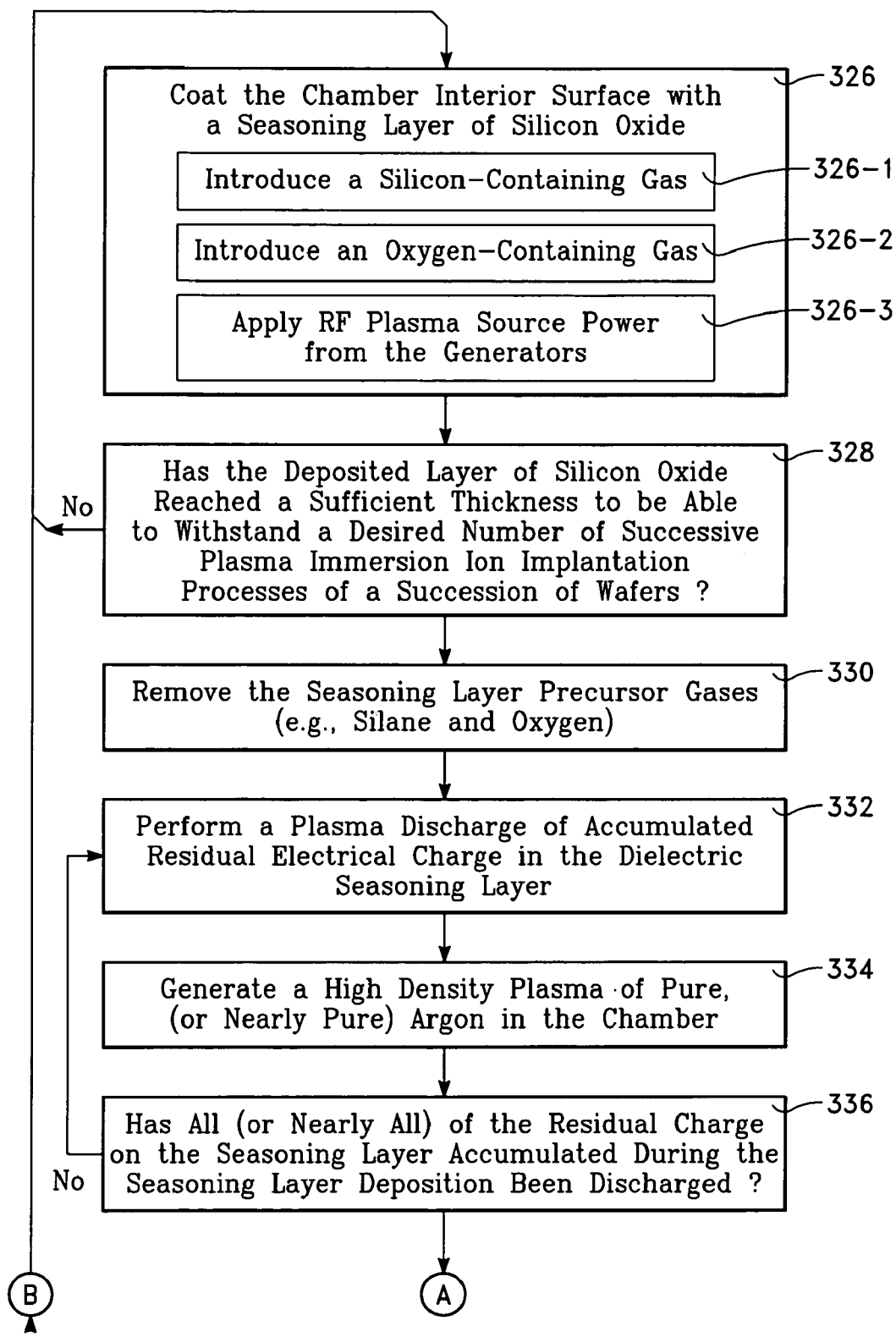
FIGS. 3A, 3B, 3C and 3D constitute a flow diagram depicting a process in accordance with another embodiment.
Figure 3B:
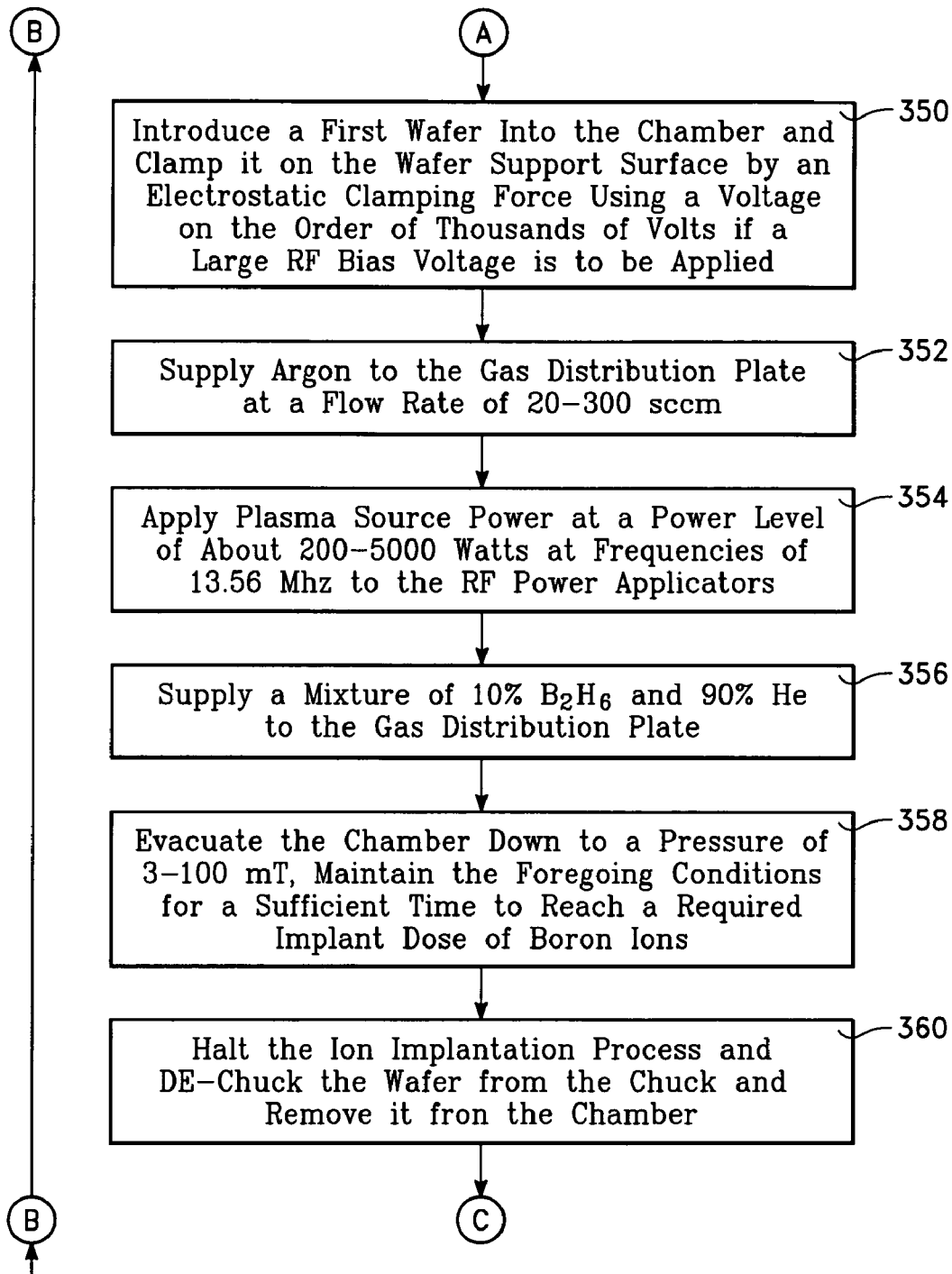
Figure 3C:
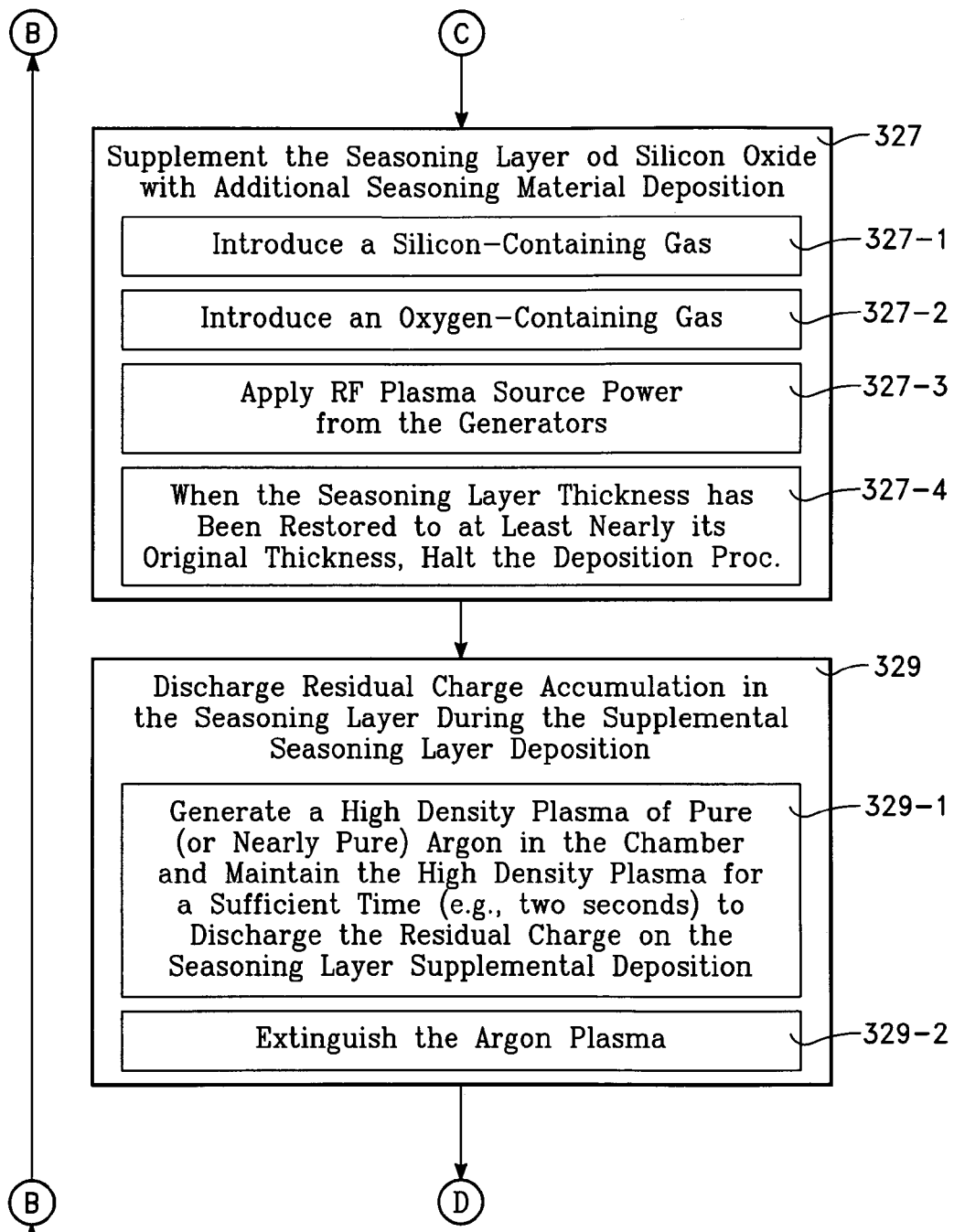
Figure 3D:
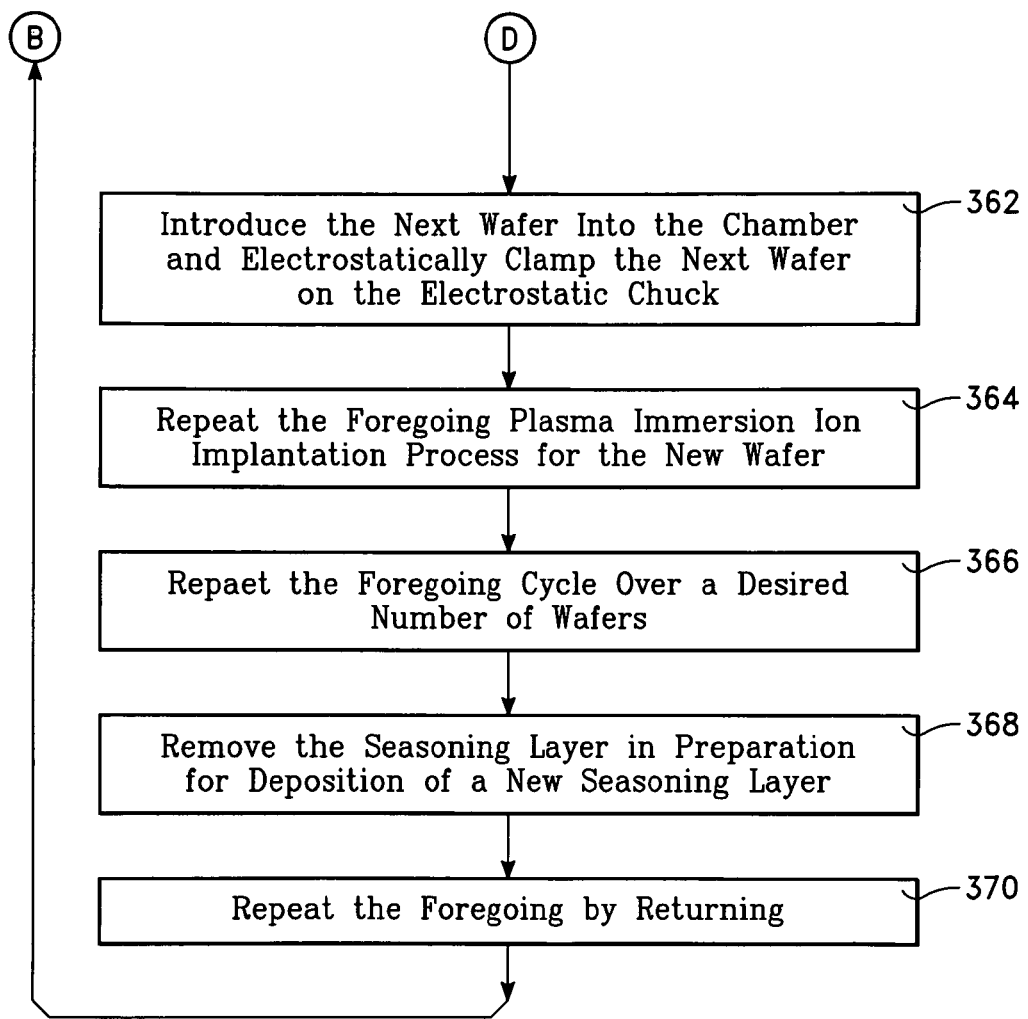

FIGS. 2A and 2B depict a process in one embodiment. Prior to introduction of a wafer into the chamber, the chamber interior surfaces are first coated with a seasoning layer of silicon oxide (block 226). This is accomplished by introducing a silicon-containing gas, such as silane (block 226-1), and oxygen or an oxygen-containing gas such as a gaseous oxide of nitrogen (block 226-2), and applying RF plasma source power from the generators 184, 184' (block 226-3) to generate and maintain a plasma for plasma enhanced chemical vapor deposition of the silicon oxide seasoning layer. This step is carried out until the deposited layer of silicon oxide reaches a sufficient thickness to be able to endure a desired number of successive plasma immersion ion implantation processes of a succession of wafers (block 228) without being reduced below a minimum "safe" thickness (e.g., 3000 Å). The initial thickness may be in a range of 4000 to 9000 Å. After the desired seasoning layer thickness has been reached, the seasoning layer precursor gases (e.g., silane and oxygen) are removed (block 230). If silane is used, the seasoning layer may consist of a silicon-oxide compound similar to pure silicon dioxide but containing a small amount of hydrogen.

The next step is to perform a plasma discharge of accumulated residual electrical charge in the dielectric seasoning layer (block 232). For this purpose, a high density plasma of pure (or nearly pure) Argon is generated in the chamber (block 234) and maintained in the manner previously described for a sufficient time (e.g., two seconds) to discharge all (or nearly all) of the residual charge on the seasoning layer accumulated during the seasoning layer deposition step (block 236).

After the plasma discharge of the seasoning layer, the chamber is ready to perform a desired number (e.g., ten) of successive plasma immersion ion implantation processes without replacing the seasoning layer. A first wafer 125 is introduced into the chamber 100 and placed on the wafer support surface 130, and an electrostatic clamping force is applied to the chuck 120 by the chucking voltage supply 200, using a voltage on the order of thousands of volts if a large RF bias voltage is to be applied (block 250). Argon gas is supplied to the gas distribution plate at a flow rate of 20-300 sccm (block 252). Plasma source power is applied by the source power generators 184, 184' each at a power level of about 200-5000 Watts at frequencies of 13.56±5 MHz to the RF power applicators 170, 175 (block 254). A mixture of 10% $B_2H_6$ and 90% He is supplied to the gas distribution plate 188 (block 256). The chamber 100 is evacuated to a pressure of 3-100 mT (block 258). These conditions are maintained for a sufficient time to reach a required implanted dose of boron ions. This dose may correspond to an electrical resistivity of the implanted polysilicon gate material in the range 100-1000 Ohm/sq. At that point, the ion implantation process is complete and is halted and the wafer 125 is de-chucked from the chuck 120 and removed (block 260). The next wafer is then clamped on the electrostatic chuck 120 (block 262), and the foregoing plasma immersion ion implantation process is repeated for the new wafer (block 264). The foregoing cycle is repeated over a desired number of wafers, e.g., 7 wafers (block 266).

Then, the seasoning layer is removed (block 264) in preparation for deposition of a new seasoning layer to be used for the next group of wafers. The seasoning layer may be removed by introducing fluorine-containing process gases and then striking a plasma. Specifically, RF power is applied from the pair of RF generators 184, 184'. This plasma is maintained until all of the seasoning layer has been removed. The foregoing process then repeats itself by returning (block 270) to the step of block 226.

In another embodiment, depicted in the flow diagram of FIGS. 3A, 3B, 3C and 3D, the number of wafers that may be processed with the same seasoning layer is increased (e.g., to a number greater than ten such as fifteen or twenty, for example) without having to further increase the initial thickness of the seasoning layer. This is accomplished by supplementing or replenishing the seasoning layer after ion implantation of each wafer with a small amount of additional silicon oxide material after the removal of the current wafer, or between successive ion implantation processes. The added material is sufficient to replace (or nearly replace) the amount of seasoning layer etched away during the previous ion implantation process. As a result, the initial thickness of the seasoning layer may be less than that required for the seasoning layer to remain above the minimum threshold during successive ion implantation of a succession of wafers (absent interim replenishment of the seasoning layer). One advantage is that, for a given seasoning layer thickness, a larger number of wafers may be processed before the seasoning layer is replaced. FIGS. 3A-3D constitute a diagram depicting a process in accordance with this latter embodiment. The process of FIGS. 3A-3D differs from the process of FIGS. 2A-2B in that the following steps are performed in the process of FIGS. 3A-3D after the completion of ion implantation and removal of the current wafer and prior to the introduction of the next wafer: The seasoning layer, which has been partially removed or thinned during ion implantation, is supplemented with a thin layer of silicon oxide or additional seasoning material deposition sufficient to restore the seasoning material to nearly its original thickness. The added amount of seasoning or silicon oxide may be a fraction of the original thickness, e.g., one angstrom or less. The supplemental or fractional deposition is carried out in the process of FIGS. 3A-3D as follows: introduce a silicon-containing gas, introduce an oxygen-containing gas, and apply RF plasma source power from the generators 184, 184'. When the seasoning layer thickness been restored to at least nearly its original thickness, this supplemental deposition process is halted. Then, residual charge accumulated in the seasoning layer during this latter supplemental seasoning layer deposition is discharged. For this purpose, a high density plasma of pure (or nearly pure) Argon is generated in the chamber and maintained for a sufficient time (e.g., two seconds) to discharge all (or nearly all) of the residual charge on the seasoning layer accumulated during the seasoning layer supplemental deposition. Thereafter, the Argon plasma is extinguished. The plasma discharge of the seasoning layer is carried out in a manner similar to the initial (pre-implant) plasma discharge step. In one example, Argon gas is supplied into the chamber at rate of 20-500 sccm while RF source power is applied in a range of about 200-500 Watts at 13.56 MHz to produce a high density plasma for about 2 seconds, or possibly less. This is sufficient to remove residual electrical charge from the seasoning layer.

A complete description of the process of FIGS. 3A-3D is now given: Prior to introduction of a wafer into the chamber, the chamber interior surfaces are first coated with a seasoning layer of silicon oxide (block 326). This is accomplished by introducing a silicon-containing gas, such as silane (block 326-1), and oxygen or an oxygen-containing gas such as a gaseous oxide of nitrogen (block 326-2), and applying RF plasma source power from the generators 184, 184' (block 326-3) to generate and maintain a plasma for plasma enhanced chemical vapor deposition of the silicon oxide seasoning layer. This step is carried out until the deposited layer of silicon oxide reaches a sufficient thickness to be able to endure a desired number of successive plasma immersion ion implantation processes of a succession of wafers (block 328) without being reduced below a minimum "safe" thickness (e.g., 3000 Å). The initial thickness may be in a range of 4000 to 9000 Å. After the desired seasoning layer thickness has been reached, the seasoning layer precursor gases (e.g., silane and oxygen) are removed (block 330). If silane is used, the seasoning layer may consist of a silicon-oxide compound similar to pure silicon dioxide but containing a small amount of hydrogen.

The next step is to perform a plasma discharge of accumulated residual electrical charge in the dielectric seasoning layer (block 332). For this purpose, a high density plasma of pure (or nearly pure) Argon is generated in the chamber (block 334) and maintained in the manner previously described for a sufficient time (e.g., two seconds) to discharge all (or nearly all) of the residual charge on the seasoning layer accumulated during the seasoning layer deposition step (block 336).

After the plasma discharge of the seasoning layer, the chamber is ready to perform a desired number (e.g., ten) of successive plasma immersion ion implantation processes without replacing the seasoning layer. A first wafer 125 is introduced into the chamber 100 and placed on the wafer support surface 130, and an electrostatic clamping force is applied to the chuck 120 by the chucking voltage supply 200, using a voltage on the order of thousands of volts if a large RF bias voltage is to be applied (block 350). Argon gas is supplied to the gas distribution plate at a flow rate of 20-300 sccm (block 352). Plasma source power is applied by the source power generators 184, 184' each at a power level of about 200-5000 Watts at frequencies of 13.56±1 MHz to the RF power applicators 170, 175 (block 354). A mixture of 10% $B_2H_6$ and 90% He is supplied to the gas distribution plate 188 (block 356). The chamber 100 is evacuated to a pressure of 3-100 mT (block 358). These conditions are maintained for a sufficient time to reach a required implanted dose of boron ions. This dose may correspond to an electrical resistivity of the implanted polysilicon gate material of in the range 100-1000 Ohm/sq. At that point, the ion implantation process is complete and is halted and the wafer 125 is de-chucked from the chuck 120 and removed (block 360).

The seasoning layer, which has been partially removed or thinned during ion implantation, is supplemented with a thin layer of silicon oxide or additional seasoning material deposition sufficient to restore the seasoning material to nearly its original thickness. The added amount of seasoning or silicon oxide may be a fraction of the original thickness, e.g., one angstrom or less. The supplemental or fractional deposition of block 327 is carried out in the process of FIGS. 3A-3D as follows: introduce a silicon-containing gas (block 327-1), introduce an oxygen-containing gas (block 327-2), and apply RF plasma source power from the generators 184, 184' (block 327-3). When the seasoning layer thickness been restored to at least nearly its original thickness, this supplemental deposition process is halted (block 327-4). Then, residual charge accumulated in the seasoning layer during this latter supplemental seasoning layer deposition (i.e., of block 327) is discharged (block 329). For this purpose, a high density plasma of pure (or nearly pure) Argon is generated in the chamber (block 329-1) and maintained for a sufficient time (e.g., two seconds) to discharge all (or nearly all) of the residual charge on the seasoning layer accumulated during the seasoning layer supplemental deposition of block 327. Thereafter, the Argon plasma is extinguished (block 329-2). The plasma discharge of the seasoning layer is carried out in a manner similar to the initial (pre-implant) plasma discharge step of blocks 232 and 234. In one example, Argon gas is supplied into the chamber at rate of 20-500 sccm while RF source power is applied in a range of about 200-500 Watts at 13.56 MHz to produce a high density plasma for about 2 seconds, or possibly less. This is sufficient to remove residual electrical charge from the seasoning layer.

The next wafer is then clamped on the electrostatic chuck 120 (block 362), and the foregoing plasma immersion ion implantation process is repeated for the new wafer (block 364). The foregoing cycle is repeated over a desired number of wafers, e.g., 7 wafers (block 366).

Then, the seasoning layer is removed (block 364) in preparation for deposition of a new seasoning layer to be used for the next group of wafers. The seasoning layer may be removed by introducing fluorine-containing process gases and then striking a plasma. Specifically, RF power is applied from the pair of RF generators 184, 184'. This plasma is maintained until all of the seasoning layer has been removed. The foregoing process then repeats itself by returning (block 370) to the step of block 326.

While the foregoing is directed to embodiments of the present invention, other and further embodiments of the invention may be devised without departing from the basic scope thereof, and the scope thereof is determined by the claims that follow.

What is claimed is:

1. A method of ion implanting a succession of semiconductor wafers in a plasma reactor, comprising:

introducing a silicon-containing gas and an oxygen-containing gas into the chamber, generating a deposition plasma in the chamber, and maintaining said deposition plasma until a silicon oxide seasoning layer of a target thickness has been deposited on interior surfaces of said chamber including a wafer support surface of an electrostatic chuck;

introducing Argon gas into the chamber and generating a conductive discharge plasma in the chamber and maintaining said conductive discharge plasma until residual electrostatic charge in said seasoning layer has been discharged;

for each one of a succession of semiconductor wafers:

(a) introducing the semiconductor wafer into the reactor and electrostatically clamping said wafer onto the season layer-covered wafer support surface;

(b) introducing a semiconductor dopant impurity-containing gas into the chamber and generating an ion implantation plasma in the chamber and maintaining said ion implantation plasma until a desired ion implant dosage has been reached;

(c) de-chucking said wafer from said wafer support surface and removing said wafer from said chamber;

(d) repeating (a), (b) and (c) for the next wafer of said succession of wafers;

after performing (a), (b), (c) and (d) for a predetermined number of wafers, introducing an etchant species-containing gas into said chamber and generating an etch plasma in said chamber and maintaining said etch plasma until said seasoning layer has been removed from said chamber interior surfaces.

2. The method of claim 1 further comprising performing the following after step (c) and before step (d):

(i) introducing a silicon-containing gas and an oxygen-containing gas into the chamber, generating a deposition plasma in the chamber, and maintaining said deposition plasma until the thickness of the silicon oxide seasoning layer has been replenished by an amount corresponding to a thickness loss occurring during (b).

3. The method of claim 2 further comprising performing the following step after step (i):

(ii) introducing Argon gas into the chamber and generating a conductive discharge plasma in the chamber and maintaining said conductive discharge plasma until residual electrostatic charge in said seasoning layer has been discharged.

4. The method of claim 1 wherein said target thickness is sufficiently great for said seasoning layer to retain a thickness above a minimum threshold during ion implantation of a successive number of wafers.

5. The method of claim 4 wherein said minimum threshold is 3000 Å.

6. The method of claim 4 wherein said target thickness is in a range of about 4000 to 9000 Å.

7. The method of claim 4 wherein said successive number of wafers is about ten.

8. The method of claim 2 wherein said thickness loss is about 1000 Å.

9. The method of claim 2 wherein said target thickness is not sufficient for said seasoning layer to retain a thickness above a minimum threshold during ion implantation of a selected successive number of wafers.

10. The method of claim 4 wherein said minimum threshold is 3000 Å.

11. The method of claim 4 wherein said target thickness is in a range of about 4000 to 9000 Å.

12. The method of claim 4 wherein said successive number of wafers is about 15-20.

13. The method of claim 3 wherein said generating a deposition plasma, said generating a conductive discharge plasma and said generating an ion implantation plasma each comprises coupling RF plasma source power to respective mutually transverse external reentrant conduits of said chamber to generate respective toroidal RF plasma currents.

* * * * *